United States Patent [19]

Kudo et al.

[11] Patent Number: 5,272,671
[45] Date of Patent: Dec. 21, 1993

[54] SEMICONDUCTOR MEMORY DEVICE WITH REDUNDANCY STRUCTURE AND PROCESS OF REPAIRING SAME

[75] Inventors: Jun Kudo, Nara; Tsutomu Ashida, Yamatokoriyama, both of Japan

[73] Assignee: Sharp Kabushiki Kaisha, Osaka, Japan

[21] Appl. No.: 679,272

[22] Filed: Apr. 2, 1991

[30] Foreign Application Priority Data

Jan. 14, 1991 [JP] Japan .................... 2-14821

[51] Int. Cl.$^5$ .................... G11C 7/00; G11C 11/34
[52] U.S. Cl. .................... 365/200; 365/178
[58] Field of Search .............. 365/178, 200, 210, 201; 371/10.3

[56] References Cited

U.S. PATENT DOCUMENTS 4,393,474  7/1983  McElroy .................... 365/200

FOREIGN PATENT DOCUMENTS 55-34443   3/1980  Japan .
59-68964   4/1984  Japan .
59-132652  7/1984  Japan .
60-79769   5/1985  Japan .
60-241257  11/1985 Japan .
60-12152   1/1987  Japan .
62-183162  8/1987  Japan .
63-77148   4/1988  Japan .

OTHER PUBLICATIONS

IEEE/IRPS '90 186-192 (Oxide-Nitride-Oxide Antifuse Reliability) Jul. 1990.

*Primary Examiner*—Steven Mottola
*Attorney, Agent, or Firm*—Nixon & Vanderhye

[57] ABSTRACT

A nonvolatile semiconductor memory device comprises a memory cell array and a redundant circuit. The memory cell array comprises a plurality of cell lines for storing fixed data. The redundant circuit comprises redundancy memory cell rows of MOS transistors, and at least one redundancy spare decoder by which at least one of the redundancy memory cell rows is selectively determined and permuted with a memory cell to be repaired. At least one of the redundancy memory cell rows has data to be recovered stored therein. The data to be recovered is stored in the redundancy memory cell rows by selectively implanting channel regions of the memory cell rows with an impurity ion of high energy.

8 Claims, 5 Drawing Sheets

SEMICONDUCTOR MEMORY DEVICE WITH REDUNDANCY STRUCTURE AND PROCESS OF REPAIRING SAME

BACKGROUND OF THE INVENTION

1. Field of the Invention

This invention relates to a semiconductor memory device and more particularly to an improvement of a redundancy structure in a nonvolatile memory device for fixed data.

2. Description of the Related Art

Nonvolatile memory devices include, for example, those having memory cells which are previously and selectively doped with an impurity under gate electrodes and adapted to store information of 1 or 0 corresponding to high or low threshold voltage. These memory devices have been widely put into practical use for various systems such as microprocessor-applied components and the like since desired data can simply be written in the devices by using a mask which results in a relatively cheaper cost for mass production. The memory devices are, therefore, suitable for and largely used as memory means for storing information for characters and symbols in various word-information processing systems such as a word processor and the like. Those nonvolatile memory devices for fixed data are inevitably required to have a larger storage capacity, but their defective bit lines are rather hard to be repaired by providing a redundancy circuit as in a DRAM and SRAM. As a result, ensuring a high yield becomes difficult in the production of the devices, under the trend of the capacity increasing from 8M and 16M bits as conventionally to the future 32M, 64M and more bits.

Next, the redundancy circuit will be detailed. Redundancy recovery techniques are is generally known to be effective in DRAM and SRAM for prevention of lowering yield of the larger storage devices. FIG. 1 exemplifies a redundancy circuit for a memory device (S. Konishi et al. IEEE ISSCC 1982, Digest of Technical Papers, pp. 258-259), wherein the memory device is provided with two redundant lines (spare lines) S1 and S2. When a defective cell C1 is present on a normal memory cell array 11, a spare decoder 13 is programmed to select an address signal corresponding to that line. FIG. 2 details the spare decoder comprising two decoders D11 and D12) which provides the relief by redundancy of two defective points.

Programming (write-in) of the spare decoder on the redundancy circuit has conventionally been carried out by means of fuse lines. The fuse lines are usually built up with polysilicon wire and the like. Upon programming, a laser beam or a high voltage is applied to the predetermined fuse in a fuse line. For example, fuses on a fuse line F1 or F2 in FIG. 2 are selectively broken down (e.g. by the application of a laser beam or electrically) to define the address of memory cell line containing a defective bit. Thereafter, either spare decoder D11 or D12 is selected and at the same time a selection inhibiting signal for the cell line to be repaired is transmitted to a cell line decoder 14. As a result, a spare line S1 or S2 is selected in place of a normal cell line to complete the relief operation by redundancy.

To apply the above redundancy structure of a RAM to a nonvolatile memory device for fixed data, written data must be repaired by redundancy as well as by a memory cell line. Thus, not only a peripheral circuit such as the spare decoder and the like but also spare memory cells are to be programmed in a nonvolatile memory device. The programming is possible in principle by using an electrical fuse or an electrically writing-enable non-volatile memory. Using the fuse or the non-volatile memory for programming allows a retest to immediately be conducted after a die sort test which is simultaneously effected at fuse-blowing or electrically writing-in.

However, these techniques have been rarely practiced due to such problems that the programming unfavorably requires a high voltage 2 to 3 times higher than normally supplied voltage with a larger current, leading to a higher breakdown voltage requirement and an additional chip area. Also, a laser fusing technique using a number of fuses in rows is difficult to be applied for a nonvolatile memory device due to the limited cell area of the device.

SUMMARY OF THE INVENTION

According to the present invention, there is provided a nonvolatile semiconductor memory device which comprises:

a memory cell array comprising a plurality of memory cell lines storing fixed data, and a redundant circuit comprising redundancy memory cell rows of MOS transistors, and at least one redundancy spare decoder by which at least one of the redundancy memory cell rows is selectively determined and permuted with at least one of the memory cell lines to be repaired, said at least one redundancy memory cell rows storing the data to be recovered and the data being stored by selectively implanting channel regions of the memory cell rows with impurity ion of high energy.

The present invention has been designed to overcome the foregoing problems. For this purpose, proposed in this invention are to constitute redundancy memory cell rows with MOS transistors and to conduct writing operation by ion implantation of the MOS transistors.

The semiconductor memory device of the present invention is a non-volatile type for storing fixed data, which is mainly composed of MOS transistors. The semiconductor memory device includes those having memory cell which are previously and selectively doped with an impurity in their channel regions under gate electrodes and adapted to store information of 1 or 0 corresponding to high or low threshold voltage. The present invention is also applicable to various non-volatile memory devices for storing fixed data, such as devices having multiply controlled threshold voltage or exhibiting asymmetic properties with exchanging of source and drain.

4(b) a sectional view taken from the line A—A' and FIG. 4(c) a sectional view taken from the line C—C'.

Figure 5:
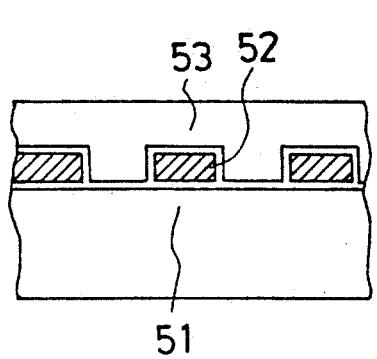
Figure 5:
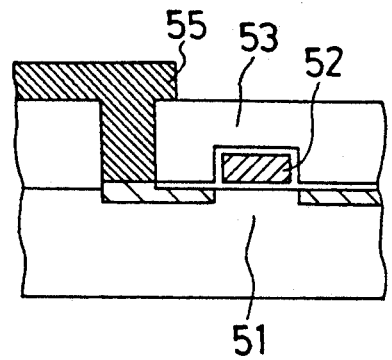
Figure 5:
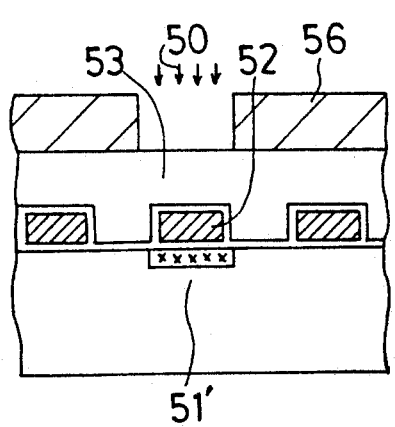
Figure 5:
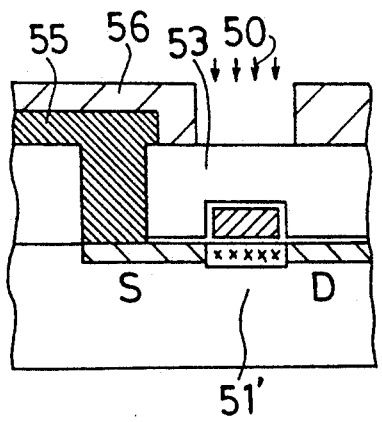

FIGS. 5(a), 5(b), and 5(c), and 5(d) are sectional views showing the structures of the redundancy memory cell transistor and the spare decoder transistor respectively of the memory device in an example of the present invention, with FIGS. 5(c) and 5(d) the showing the steps of ion implantation.

Figure 6:
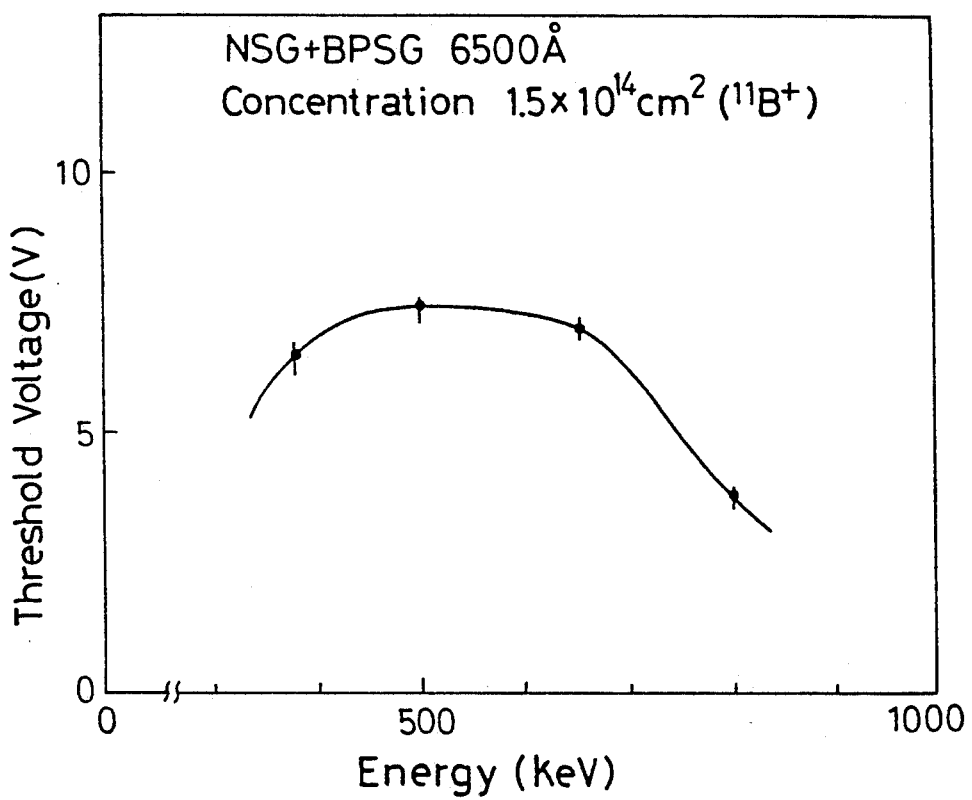

FIG. 6 is a graph showing a relationship between an ion energy under implantation and threshold voltages of the transistors in the examples of the present invention.

Figure 7:
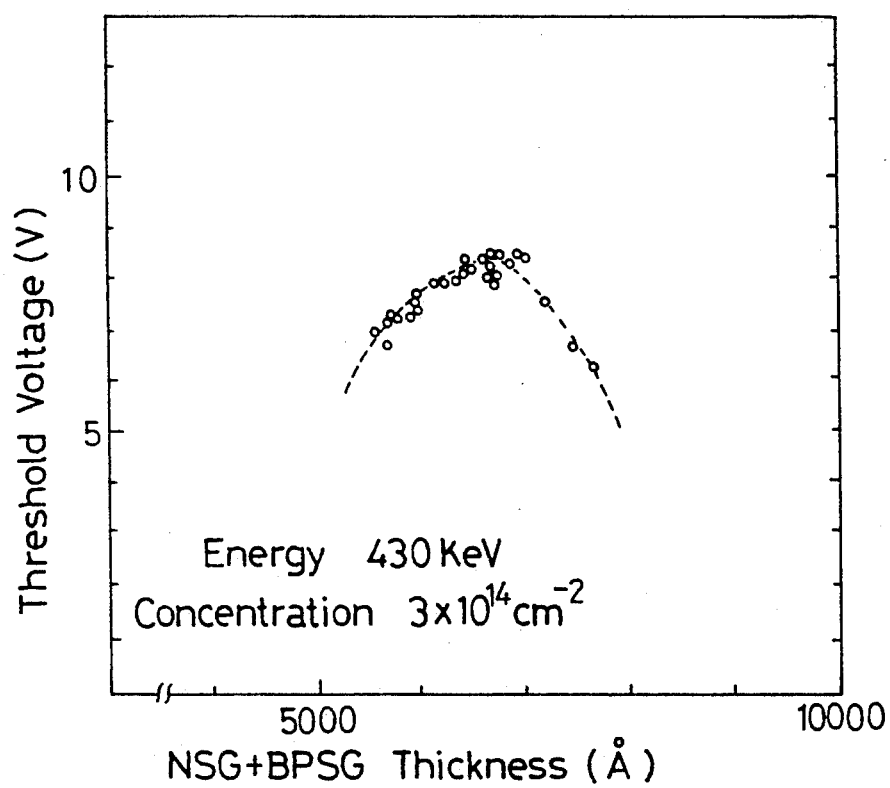

FIG. 7 is a graph showing a relationship between thickness of the dielectric layer and threshold voltages of the transistors under implantation in the examples of the present invention.

DETAILED DESCRIPTION OF THE PREFERRED EMBODIMENTS

Figure 1:
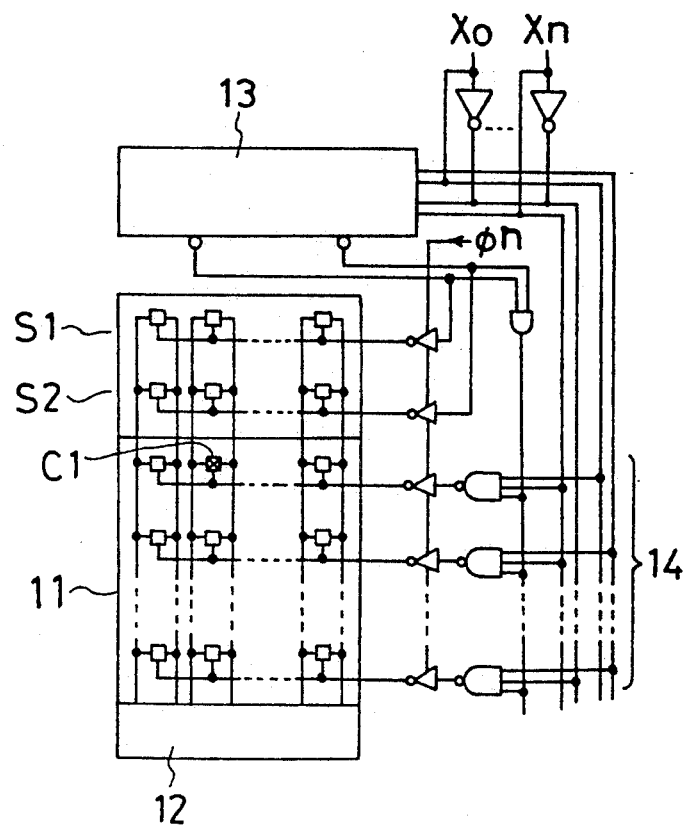
FIG. 1 is a block diagram showing a circuit structure of a memory device with a redundancy circuit including the semiconductor memory device of the present invention.
Figure 2:
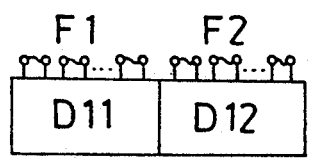
FIG. 2 is a schematic diagram showing an example of a spare decoder used in the memory device shown in FIG. 1.

An embodiment of the invention will be detailed by exemplifying a nonvolatile memory device for fixed data. In the nonvolatile memory devices the memory cells in the memory cell lines are previously doped with an impurity under gate electrodes and adapted to store information of 1 or 0 corresponding to high or low threshold voltage. Although, FIG. 1 illustrates a typical circuit structure used in a DRAM, SRAM and the like, the present invention uses the same structure but that the redundancy circuit is modified with its fabrication technique in order to realize the redundancy repair for the nonvolatile memory.

When a line containing a defective bit is found by a test of the memory cell lines for storing fixed data, normal data to be stored in that line is first written in a spare line (row) of the redundancy memory cell rows by ion implantation. The writing may be performed after wiring of the device or after opening a hole for an electrode following deposition of a passivation film. That is, writing the spare memory cells in the spare line is carried out by varying threshold voltages of MOS transistors constituting the spare memory cells by means of a high energy ion implantaion.

Figure 3:
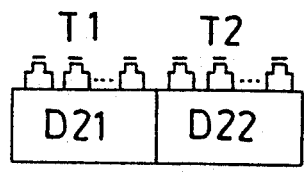
FIG. 3 is a schematic diagram showing a modified example of a spare decoder.

Programming of the redundancy spare decoder may be conducted by using electrically write-enable nonvolatile device, such as an EPROM or EEPROM. An electrical fuse, a laser fuse or the like may also be used for programming. The method most effective for programming of the spare decoder of the present invention is by the use of MOS transistor rows T1, T2 (spare decoders D21, D22) shown in FIG. 3. In this embodiment, on - off control is carried out by varying the threshold of the transistor through a high energy ion implantation, similarly with the writing in the spare lines, whereby programming of the redundancy memory cell rows and the redundancy spare decoder can be performed simultaneously and commonly.

In case of using NMOS transistor rows for operation of spare decoder, gate voltages therefor may be set to a level, for example, of usual supply voltage for the transistor.

In the present invention, the data to be permuted is stored in the redundancy memory cell rows by an ion implantation. Hence, the device surface area can be reduced and the structure of devices can be simplified, in comparison with the conventional redundancy-structured devices wherein writing is to be performed by the use of a high voltage and a large current.

Furthermore, when writing of the selection data in the redundancy spare decoder is performed by the ion implantation similarly with the above, the device surface area can be further reduced and the device structure may be more simplified, and writing of the data to be recovered and the selection data can be performed simultaneously.

EXAMPLES

Next, the invention will be further detailed with referring to the examples.

First, specific memory cells including the memory cell array and the redundancy memory cell rows (11, S1, S2 in FIG. 1) were formed with NMOS transistors, and transistor rows (T1, T2 in FIG. 3) of a spare decoder 13 were also formed with NMOS transistors. Threshold voltages of those NMOS transistors were initially set to a lower value (i.e., ON state) than that applied to the gate according to a phosphorus ion implantation, thereby forming a NOR type nonvolatile memory device for fixed data. That is, each threshold value of the transistors constituting the memory cells is set, prior to the formation of a gate electrode, to a lower value to enable ON state ('0') in operation. In the memory cell lines, the memory cell to be changed to '1' state was implanted in its channel region with boron ion by using a mask after formation of the gate electrode to develop a higher threshold value, for example, than the usual supply voltage, in order to store a fixed data in the memory cell line. The redundancy memory cell rows (spare lines) S1, S2 and the transistor rows T1, T2 were kept to have a lower threshold voltage to enable ON state.

Figure 4:
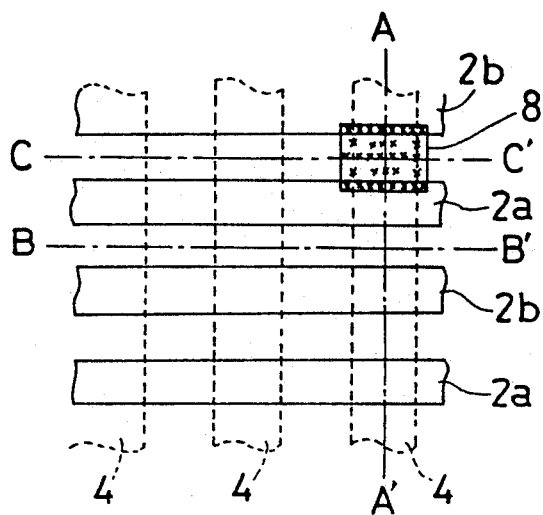
FIGS. 4(a), 4(b) and 4(c) are schematic diagrams showing a memory device of an example of the present invention, FIG. 4(a) being a plan view thereof, FIG.
Figure 4:
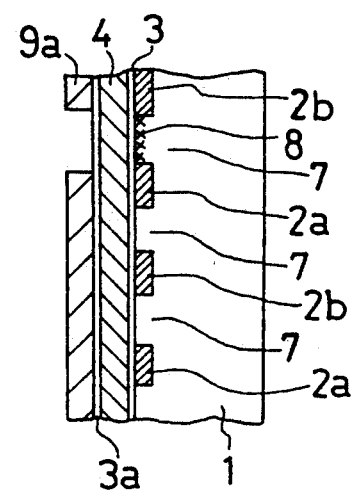
Figure 4:
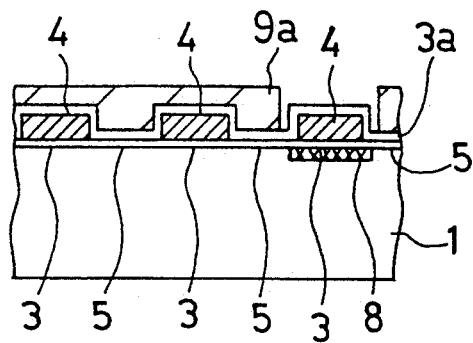

The device was then processed for forming metal wiring, protective film and opening of electrode pad. FIG. 4 shows a structure of the memory cells of the memory device of the present example. The memory cell array and the redundant memory cell rows are similarly structured. These memory cells are so constructed that a plurality of elongated sources and drains 2a and 2b in parallel with each other are arranged on a substrate 1, and gate electrodes 4 are laid perpendicularly to the sources and drains 2a and 2b. These memory cells are horizontally arranged in a row to provide a integrated memory cell structure. Reference numeral 3 designates a gate insulating film and 8 an impurity-implanted region.

Such a memory device was fabricated by the following steps.

First, an isolation region was formed in the region for a peripheral circuit over the substrate according to a known LOCOS oxidation technique. Then, phosphorus was injected in the regions where the memory cell array, the redundancy memory cell rows and the spare decoder were to be formed, in order to initially set the threshold voltages in these regions to lower than 1.0V. Then, using a photoresist mask, an impurity was partially injected in the silicon substrate 1 by ion implantation to form a plurality of elongated source regions 2a and elongated drain regions 2b of 0.5 to 2.0 μm width in parallel to each other. Between the source and drain regions are channel regions whose width is suitably set to 0.5 to 2.0 μm. Then, the gate insulating film 3 of 10 to 40 nm thickness was formed on the silicon substrate 1 by a thermal oxidation technique on which a gate electrode material was deposited. The deposited layer was then subjected to photolithography to form a plurality of elongated gate electrodes 4 extending apart from each other at an interval of 0.5 to 2.0 μm and perpendicularly to the source and drain regions and having cross-sections of 0.5 to 2.0 μm width and 0.3 to 0.6 μm thickness. Formation of the gate electrodes may be conducted by depositing polycrystalline silicon, high melting point metals (W, Ti, Pt, Mo) or their silicides (WSi, TiSi, PtSi, MoSi), for example, with the CVD process and the sputtering process, followed by a conventional lithography. The silicon oxide layer 3a was then formed on the gate electrode according to the CVD process.

Next formed is a resist pattern 9a having openings each placed selectively at the intersections of the gate electrodes 4 and the channel regions 7. Boron ions of 120 to 240 KeV, the suitable energy depending upon the thickness of the gate electrodes, were applied toward the resist pattern 9a to form an impurity-implanted region 8 in the channel regions 7 underlying the gate electrodes 4 to make writing of information to be stored.

An impurity was thereafter injected in the source and drain regions of the transistors constituting the peripheral circuit, followed by the formation of an insulating layer comprising two layers of NSG and PSG in a total thickness of 0.2 to 1.0 μm. After forming contact portions for source and drain, metal wiring was formed to complete the device having a redundancy circuit without programmed. Structural sections of the redundancy memory cell rows and the fuseequivalent portion of the peripheral spare decoder are shown in FIGS. 5(a) and 5(b), and therein provided are a channel 51 controlled by threshold voltage to be low, a gate electrode 52, an insulating film 53 and a metal wiring 55. The metal wiring may be made of W, Mo or their silicides or other high melting point metals, but is usually provided by Al family metals or a lamination of the same with TiW, TiN and the like.

The die sort test applied to a wafer is usually conducted to the above device directly, but may be effected after the formation of passivation film as a protective layer.

When any defective bits are found in a normal memory cell line of the array, information to be stored in this line is written in a redundancy memory cell row. The writing operation may be conducted by the use of a mask or a resist pattern formed by laser or electron beam lithography. The latter technique is faster. The writing operation may also be carried out by a maskless- direct etching and injection technique using a converging ion beam. In this example, after the formation of a resist pattern 56 (1.0 to 3.0 μm in thickness) shown in FIGS. 5(c) and 5(d). A boron ion 50 with a high energy of 300 to 1000 KeV (which is higher than that used for a usual writing in memory cell), is applied to selectively change an ON state of predetermined cells in the memory cell rows to an OFF state having a threshold voltage equal to or more than a voltage applied to the gate. Programming (writing) of the spare decoder can be similarly performed simultaneously with the above operation.

The ion implantation is preferable to be uniformly completed in the channel regions in the present method, so that the metal wiring should be laid, as shown in FIGS. 5(b) and 5(d), to be apart from any channel regions which may require injection of a high energy ion.

FIG. 6 shows a relationship between an ion acceleration voltage and a threshold voltage of NMOS transistors in case of boron ion implantation after completion of the metal wiring but before the formation of the passivation film. The total thickness of the gate electrodes was 400 nm and that of the dielectric 650 nm. The total thickness of the gate electrode is preferably set in a range of 0.15 to 0.8 μm to insure an excellent conductivity and to avoid hindering the efficiency of the ion implantation. Suitable energy of boron ion to obtain a threshold voltage 5V or more depends on a total thickness of the layers lying over the channels and is preferably 300 to 600 KeV in case of an ion implantation before deposition of the passivation film after completion of the metal wiring and 600 to 1000 KeV after deposition of the passivation film. The amount of the ion injected is preferably $10^{13}$ to $10^{14}$ cm$^{-2}$. Also, when the ion energy is excessively high, transverse diffusion of scattered ion badly influences and interferes adjacent devices. To eliminate the bad influence and prevent necessity of enlargement of surface area, intervals between the gate electrodes of the cells in the redundant memory cell rows having a similar structure with that shown in FIG. 4 is preferably set to 0.5 to 2.0 μm. Also, the energy for ion implantation is preferably set to 600 KeV or less. For this purpose, the thickness of the insulating film 53 may be set in a range of 300 to 800 nm, as seem in FIG. 7, before the passivation process. The thickness of the resist pattern 56 used for the ion implantation is preferably set in a range of 1.0 to 3.0 μm.

The device was then subjected to annealing after ion implantation to activate the doped impurities. In case of the implantation being conducted after completion of wiring by the use of a low melting point metal of an Al family, the temperature for the annealing is preferably 500° C. or lower. A leakage current of the transistors of 1nA or less which is a sufficient property for device operation can be obtained by the annealing in N$_2$ or H$_2$ at 450° to 500° C. for 0.5 to 2 hours.

Also, the threshold voltages of the transistors subjected to the high energy ion implantation can be set to a higher value of 5 to 10V, so that the confirmation of bit '0' or '1' of each memory cells can be effected easily.

In the above example, OFF→ON control of NMOS transistors was used for programming of the spare decoder. Alternatively, OFF→ON control of the spare decoder may be used for programming the NMOS transistors. In this case, phosphorus (P), arsenic (As) and the like may be employed for the high energy impurity ion. Also in the latter case, programming of the spare decoder and writing in the redundant memory cell rows may be performed simultaneously by a high energy ion implantation of the above impurity ion for a memory device.

As explained above, the present invention uses a high energy ion implantation to recover a defective bit line in a non-volatile memory device after its fabrication. Nonvolatile memory devices are hitherto hard to be repaired by the redundancy, as are volatile memory devices such as DRAM and SRAM, since specific data has already been stored and fixed by the use of a mask through fabrication. According to the present invention, data repair by redundancy can effectively be completed by using the high energy ion implantation for writing, in the redundancy memory cell rows, the data to be permuted.

Accordingly, the present invention permits a nonvolatile semiconductor memory device of large storage capacity to be fabricated with a higher yield due to the data repair by redundancy.

What we claimed is:

1. A nonvolatile semiconductor memory device which comprises:

a memory cell array comprising a plurality of memory cell liens storing fixed data, and a redundant circuit comprising redundancy memory cell rows of MOS transistors, and at least one redundancy spare decoder by which at least one of the redundancy memory cell rows is selectively determined and permuted with at least one memory cell line to be repaired, said at least one redundancy memory cell rows storing the data to be recovered and the data being stored by selectively implanting channel regions of the redundancy memory cell row with an impurity ion of high energy.

2. The semiconductor memory device of claim 1 in which the redundancy spare decoder comprises MOS transistors and in which data for the selective determination is stored in the spare decoder by selectively implanting channel regions of the MOS transistors with an impurity ion of high energy.

3. The semiconductor memory device of claim 1 in which the MOS transistors constituting the redundancy memory cell rows have gate electrodes having a thickness of 0.15 to 0.8 $\mu$m.

4. The semiconductor memory device of claim 1 in which the impurity ion is of boron, phosphorus or arsenic, and the amount of the impurity ion in each of the channel regions is $10^{13}$ cm$^{-2}$ to $10^{14}$ cm$^{-2}$.

5. A process for fabricating a nonvolatile semiconductor memory device, the process including :
providing:

(a) memory cell array, the memory cell array comprising a plurality of memory cell lines storing fixed data, and, (b) a redundant circuit comprising redundancy memory cell rows of MOS transistors, and at least one redundancy spare decoder by which at least one of the redundancy memory cell rows is selectively determined and permuted with at least one memory cell line to be repaired, forming a metal wiring for each of the MOS transistors of the redundancy memory cell rows, depositing a passivation layer and then forming an opening in the passivation layer for electrode connection to the metal wiring for each of the MOS transistors of the redundancy memory cell rows, and selectively implanting channel regions of the memory cell rows for storing the data to be recovered.

6. The process of claim 5 in which the redundancy spare decoder comprises MOS transistors and data for the selective determination is being stored in the spare decoder by selectively implanting channel regions of the MOS transistors with an impurity ion of high energy after step (a) or the step (b).

7. The process of claim 5 in which the impurity ion of high energy has an energy of 300 to 1000 KeV, and a gate electrode comprising the redundancy memory cell rows has a thickness of 0.15 $\mu$m to 0.8 $\mu$m.

8. The process of claim 5 in which the impurity ion is of boron, phosphorus or arsenic.

* * * * *